United States Patent
Bushey et al.

(10) Patent No.: US 6,747,494 B2
(45) Date of Patent: Jun. 8, 2004

(54) PPL ARRANGEMENT, CHARGE PUMP, METHOD AND MOBILE TRANSCEIVER

(75) Inventors: Thomas P. Bushey, Apache Junction, AZ (US); Jeremy W Moore, Chandler, AZ (US); Morgan Fitzgibbon, WaterPark (IE)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/077,467

(22) Filed: Feb. 15, 2002

(65) Prior Publication Data

US 2003/0155951 A1 Aug. 21, 2003

(51) Int. Cl.[7] .................................................. H03L 7/06
(52) U.S. Cl. ...................................... 327/148; 327/157
(58) Field of Search ................................. 327/148, 157, 327/536, 537, 306, 331

(56) References Cited

U.S. PATENT DOCUMENTS

| | | | |
|---|---|---|---|
| 5,699,387 A | * 12/1997 | Seto et al. ................... | 327/157 |
| 5,722,052 A | 2/1998 | Abdi ............................ | 455/75 |
| 6,160,432 A | 12/2000 | Rhee ........................... | 327/157 |
| 6,181,210 B1 | * 1/2001 | Wakayama .................. | 327/157 |

FOREIGN PATENT DOCUMENTS

EP 0608151 B1 7/1994

OTHER PUBLICATIONS

PCT International Search Report PCT/EP02/13199.

* cited by examiner

Primary Examiner—Tuan T. Lam

(57) ABSTRACT

A charge pump arrangement for a phase-locked-loop has a current source circuit (60) which provides charging current to the phase locked loop, and a current sink circuit (90) which depletes charging current from the phase locked loop. The current source circuit (60) and the current sink circuit (90) have slew rates which have a predetermined relationship. In this way, the charge pump causes substantially no non-linear charge injection in the phase-locked-loop. Cascoded current mirrors (75, 85) are utilised to provide a high voltage with thin gate oxide technology. The arrangement has a relatively small die size. Since bias currents of the arrangement are mirrored according to the output current required, improved transient times are produced, leading to reduced phase noise.

8 Claims, 5 Drawing Sheets

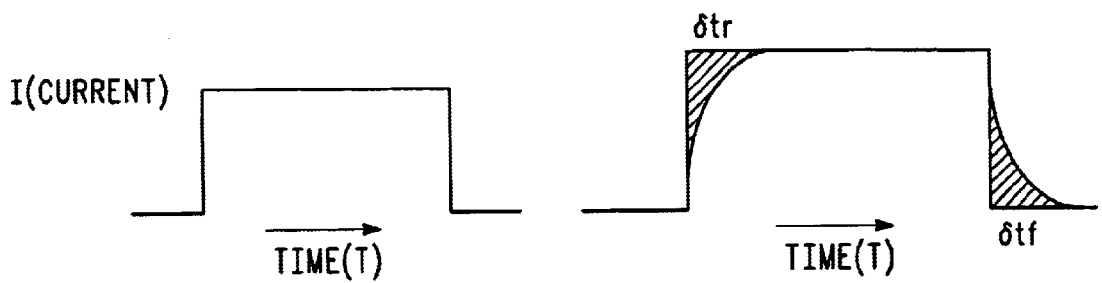
*FIG. 3A*   *FIG. 3B*
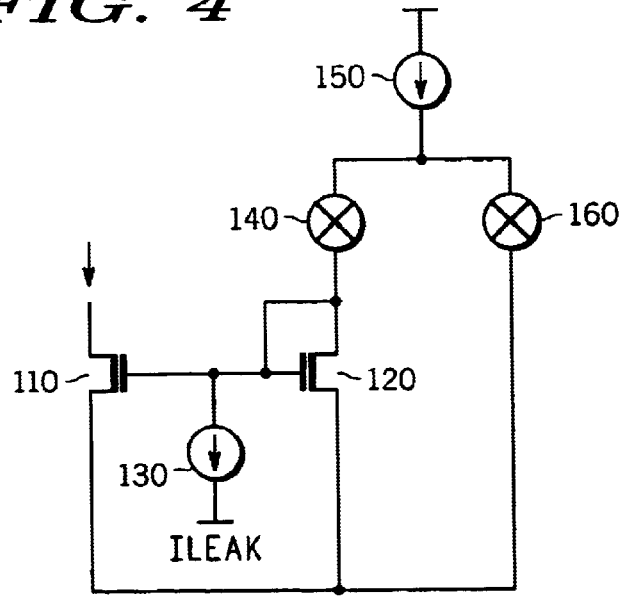
*FIG. 4*

PPL ARRANGEMENT, CHARGE PUMP, METHOD AND MOBILE TRANSCEIVER

FIELD OF THE INVENTION

This invention relates to charge pumps that are used in PLLs (Phase Locked Loops) for applications such as frequency synthesis/clock generation.

BACKGROUND OF THE INVENTION

In the field of this invention it is known that for Fractional N (FRAC-N) PLL arrangements, linearity of the associated charge pump is a key requirement. A major problem in the circuit design of such charge pumps is achieving a required level of linearity around the "lock" condition.

The nature of PLL modulation during the "lock" condition requires that extra charge is added or taken out of the loop filter, the charge being proportionate to the modulation.

In the case of a mobile cellular telecommunications device arranged to transmit using a direct digital modulation technique and using a PLL as described above, the tuning line voltage of a Voltage Controlled Oscillator (VCO) of the device is modulated, which in turn causes Frequency Modulation (FM) on a transmit (or TX) output of the device. Non-linearity of the PLL in this arrangement leads to unwanted noise at the TX output.

The modulation rate can vary in steps as high as the period of the highest expected frequency (for example ~1 ns for a GSM—Global System for Mobile telecommunication—device) over a range of a number of periods (dictated by the modulation) of the lowest expected frequency around the Integer "lock" condition.

Hence the overall charge transferred to a loop filter of the PLL over these conditions has to be substantially linear so that the FM modulation of the VCO output in closed loop is proportionate to the data being transmitted by direct digital modulation technique.

Furthermore it is known that in the locked condition an intentional leakage current can be added to the source current of the loop filter such that a 'down' portion of the charge pump is toggled during the "lock" condition to compensate or to sink current equal to the sourced current over one reference period. Therefore the linearity depends on the constant sourced current and the pulsed 'down' current.

The relatively high currents (1.26 mA) required to achieve the gain of the Phase Frequency Detector for a GSM application are typically provided by large Field Effect Transistors (FETs) with associated parasitic capacitances, and these parasitics cause unwanted charge injection and clock feed-through when switched, resulting in non-linearity around the "lock" condition as well as longer acquisition time with increased power dissipation.

"A NEW LOW VOLTAGE CHARGE PUMP CIRCUIT FOR PLL", by Robert C. Chang and Lung-Chih Kuo, ISCAS 2000—IEEE International Symposium on Circuits and Systems, May 28–31, 2000, Geneva, Switzerland, describes a 1.5V application using Wide Swing Current Mirrors and current steering techniques to tackle these noise problems.

However, this approach has the disadvantages that it provides a limited output impedance, operates with a limited supply voltage and is relatively complex, having two stages. In the context of cellular transceiver equipment, the charge pump must be able to work over a voltage range as large as possible, and a suitably large supply voltage is required. Furthermore in such an application a PLL arrangement must be relatively simple and inexpensive.

A need therefore exists for a PLL arrangement, charge pump, method and mobile transceiver wherein the above-mentioned disadvantage(s) may be alleviated.

STATEMENT OF INVENTION

In accordance with a first aspect of the present invention there is provided a charge pump as claimed in claim 1.

In accordance with a second aspect of the present invention there is provided a PLL arrangement as claimed in claim 2.

In accordance with a third aspect of the present invention there is provided a mobile transceiver as claimed in claim 3.

In accordance with a fourth aspect of the present invention there is provided a method as claimed in claim 5.

Preferably the charge pump further comprises first and second transistors coupled in cascode arrangement between the current source circuit and the current sink circuit.

The current source circuit and the current sink circuit preferably each have switching transistors arranged to be switched via their source electrodes. Preferably the current sink circuit includes a positive feedback arrangement.

The phase-locked-loop arrangement is preferably provided for a cellular transceiver. Preferably the cellular transceiver is a GSM device. Alternatively the cellular transceiver is a 'post-2G' generation device.

In this way bias currents of the arrangement are mirrored according to the output current required, leading to improved transient times and reduced phase noise.

BRIEF DESCRIPTION OF THE DRAWINGS

One PLL arrangement, charge pump, method and mobile transceiver incorporating the present invention will now be described, by way of example only, with reference to the accompanying drawings, in which:

FIGS. 3a and 3b show graphs of an ideal switched current response and a switched current response respectively of the charge pump of FIG. 2;

FIG. 4 shows an illustrative block diagram of one embodiment of the pulse down block 90 of FIG. 2;

DESCRIPTION OF PREFERRED EMBODIMENT(S)

Figure 1:
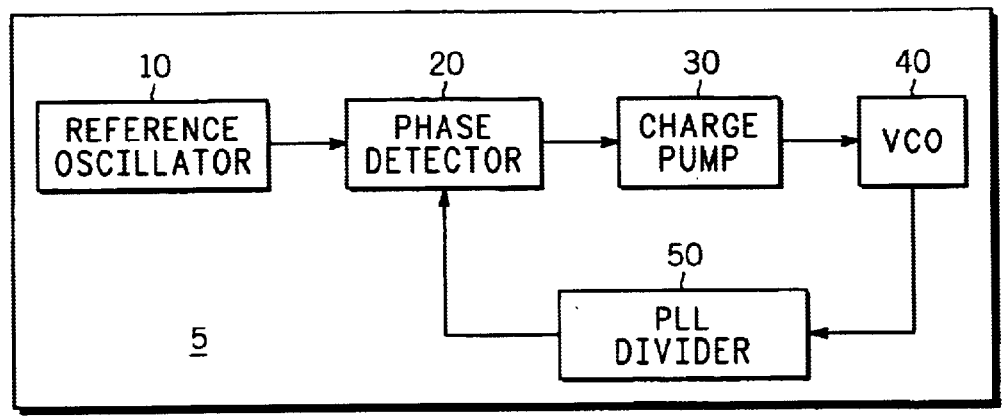
FIG. 1 shows an illustrative block diagram of a prior art PLL arrangement.

Referring to FIG. 1, there is shown a prior art Phase-Locked-Loop (PLL) arrangement 5, incorporating a charge pump 30.

A reference oscillator 10 provides a reference AC voltage to the charge pump 30 via a phase detector 20. An output of the charge pump 30 is coupled to a VCO 40.

A PLL divider 50 is coupled to receive an output from the VCO 40, and is further coupled to provide an output to the phase detector 20, providing a feedback loop.

Figure 2:
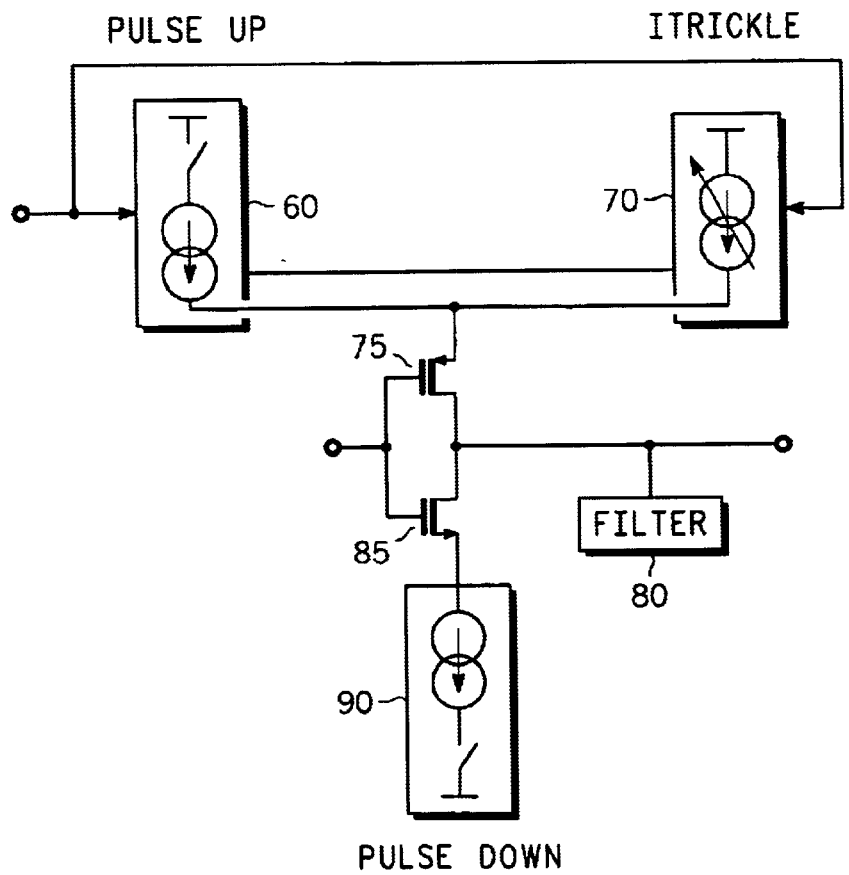
FIG. 2 shows an illustrative block diagram of a high voltage charge pump in accordance with the invention.

Referring now also to FIG. 2, there is shown a detailed block diagram of a high voltage charge pump in accordance with a preferred embodiment of the present invention, to be used in place of a typical charge pump, in a PLL arrangement such as that of FIG. 1. The charge pump includes a 'Pulse Up' block 60, a 'Pulse Down' block 90, an 'Itrickle' block 70 and first and second Field Effect Transistors (FETs) 75 and 85 respectively, to be further described below. It should be noted that the filter block 80 is not part of the charge pump but a component of the PLL application.

The present exemplary embodiment relates to a GSM or similar Fractional-N PLL Synthesiser implemented in a so-called '2G' ($2^{nd}$ generation) mobile telephone or similar cellular device, although the invention may also be used in 'next generation' or 'post-2G' generation cellular devices such as GPRS (often referred to as '2.5G') or UMTS (often referred to as '3G') . . . In this GSM application the output current of the charge pump (gain) is 1.26 mA for TX (Transmit) and 500 $\mu$A for RX (Receive).

The application requires a high voltage (5V) and for this purpose the two 3V FETs 75 and 85 are provided, in cascode arrangement as shown in FIG. 2. These are biased using a resistive divider as a mid-supply (~2.5V) thus splitting the voltage so as not to stress the FETs 75 and 85 when sourcing and sinking current.

In operation, the charge pump provides a required amount of charge as follows:

$$Q = I(\text{current}) \times T(\text{time})$$

Charge is added or sourced to the loop filter 80 via an 'up' pulse provided by the Pulse Up block 60, or subtracted or sinked from the loop filter 80 via a 'down' pulse from the Pulse Down block 90.

Note that in the locked condition the Pulse Down block 90 is the only block of the charge pump that is active because the Itrickle block 70 is a constant sourcing current to set the locked condition in this way. The time (T) is the phase difference output of the Phase Detector 20 of the PLL for switching the current from the Pulse Down block 90.

FIGS. 3a and 3b show the transient responses required of the Charge Pump. FIG. 3a shows the ideal response of switching current from the loop filter for a time (T) to give the required charge Q.

In practice when a cascoded current source is switched the response is not as depicted in FIG. 3a. As current rises there is an unwanted overshoot and undershoot if the sink current is switched at the drain of the constant down current.

Referring now also to FIG. 4, there is shown a block diagram of the Pulse Down block 90 of FIG. 2, comprising first and second transistors 110 and 120 respectively, each having gate, source and drain electrodes, first and second differential switches 140 and 160 respectively, and first and second current sources 130 and 150 respectively.

The first and second transistors 110 and 120 respectively are MOSFET (Metal Oxide Semiconductor Field Effect Transistor) devices, each having a gate electrode coupled to the first current source 130, which sources a current Ileak. The second current source 150 is coupled via the first differential switch 140 to the source electrode of the second transistor 120, and via the second differential switch 160 to the drain electrodes of the first and second transistors 110 and 120 respectively.

The second current source is arranged to source a current of 4xIleak. The source electrode and the gate electrode of the second transistor 120 are coupled together.

The unwanted charge injection referred to above is due to the charge that has built up in the junctions of the first transistor 110 of the charge pump of FIG. 4, in the case where the switch is placed at the drain of this device 110. When the time, delta t becomes comparable to the time (T) the percentage of charge error increases to cause non-linearity.

By integrating this switching with the sinking down current, predictable transients are achieved as depicted in FIG. 3(b). There is a finite time $\delta tr$ for the charging current to turn on and a finite time $\delta tf$ for it to turn off but there is no unwanted overshooting or undershooting. Therefore non-linearity is avoided as would be the case if the drain of a constant current sink were switched.

It is therefore possible to maintain charge conservation by so arranging the charge pump circuitry to ensure that the charge lost by the finite rise time $\delta tr$ is the same as the charge gained by the finite fall time $\delta tf$. In other words, the area under the charge curve is so arranged that it is equivalent to the area under the curve in the ideal case of FIG. 3a. In this way although the charge curve is not ideal, the amount of charge sourced or sinked is equivalent to that of the ideal curve of FIG. 3a.

In the specific implementation described, the charge pump circuitry must be arranged such that the rise time $\delta tr$ is 3 times faster than the fall time $\delta tf$ in order to achieve a charge equivalent to that of the ideal curve, and this will be further described below.

The requirement for the rise time (and the fall time) is that the slew rate is much less than 1 ns, ideally in the pico-second region or less. It is important to note that the Slew Rate is dependent on the bias current as a proportion of the capacitance at the charging node.

In operation, and referring again to FIG. 4, when the first differential switch 140 is closed and the second differential switch 160 is open, the second transistor 120 charges up to support the bias current 3x(=4x−1x) Ileak, and thus 3 x Ileak current is mirrored across to first transistor 110.

Similarly, when the first differential switch 140 is opened and the second differential switch 160 is closed, the leakage current 1x discharges the second transistor 120, and the first transistor 110 is turned off.

In this way the resulting biasing current is (4x−1x) i.e. 3x Ileak current. The capacitance of the arrangement is dependent upon the capacitances of the first and second transistors 110 and 120 respectively. Particularly the capacitance at the diode connected node can be approximated to:

$$CGS\ (120) + CGS\ (110) + CDB\ (140) + CDB\ (130)$$

where CGS is Gate-to-Source capacitance of the device and CDB is Drain-to-Bulk capacitance of the device.

Figure 5:
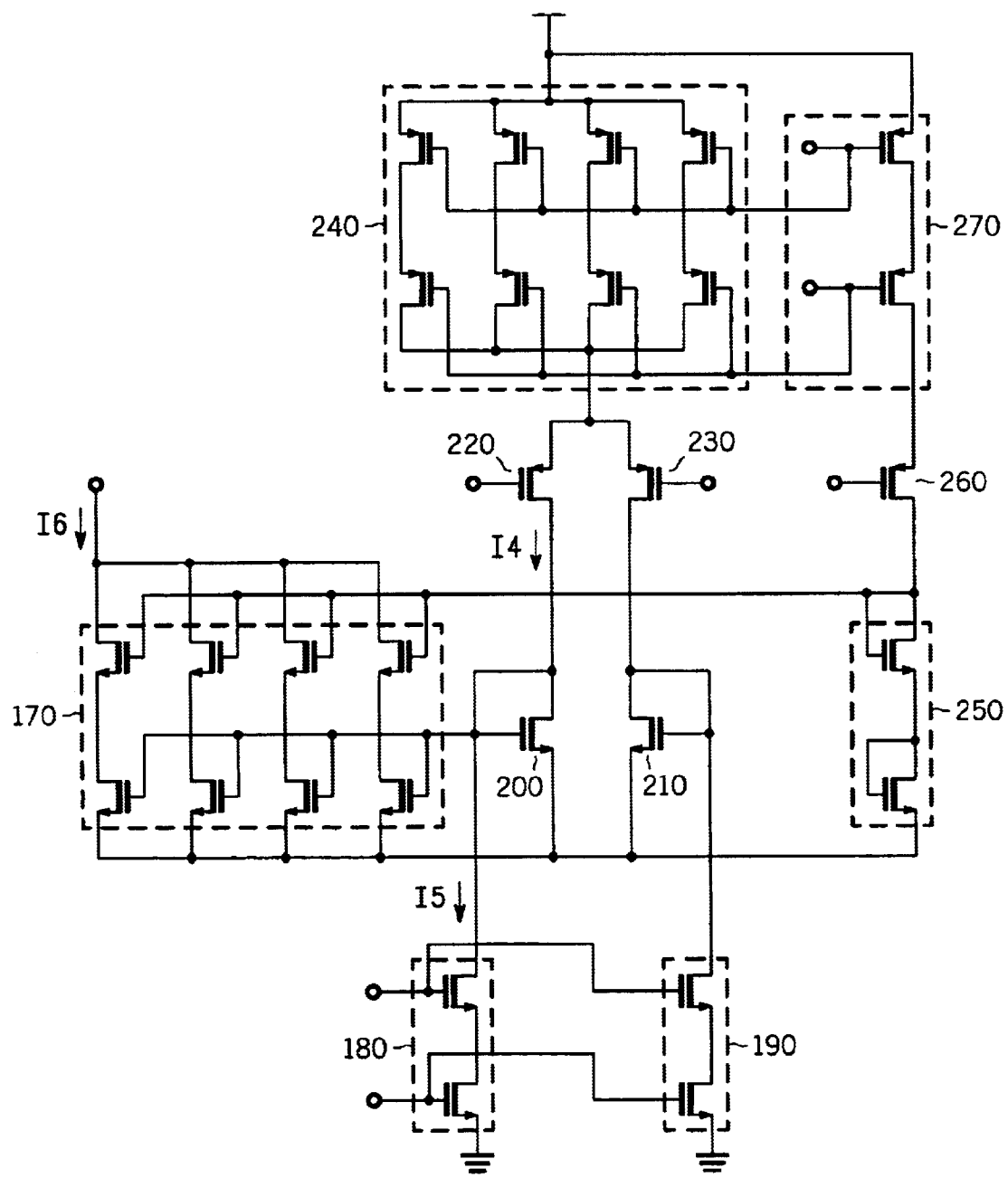
FIG. 5 shows a detailed circuit implementation of the pulse down block 90 of FIG. 2.

Referring now also to FIG. 5, there is shown a detailed circuit diagram of the pulse down block 90 of FIG. 2 (shown in less detail in FIG. 4). The following references correspond:

| FIG. 4 | FIG. 5 |
|---|---|
| First transistor 110 | Transistors 170 |
| Second transistor 120 | Transistor 200 |
| First current source 130 | Current source 180 |
| First differential switch 140 | Differential switch 220 |
| Second current source 150 | Transistors 240 |
| Second differential switch 160 | Differential switch 230 |

Devices 250, 260, and 270 are provided for biasing purposes. Also, due to the complementary switching arrangement, devices 190, 210, 230 are similar to 180, 200 and 220 in order to achieve true differential operation i.e. the same loading.

Transistors 170 are a number of mirrored devices in parallel. The capacitance of transistors 170 is given by the sum of the CGS of a bottom device+CDB of a top device (cascode device) *8/3(the scaling factor to get 1.26 mA).

The charging node of the arrangement is the drain electrode of the second transistor 120. It will be understood that the charging node must be charged to a control gate voltage of a threshold voltage above the minimum output voltage of the second transistor 120 i.e. Vdsat=(Vomin)+Vt.

To achieve a Slew Rate of significantly less than 1 ns the bias current must be increased and/or the capacitance at the charging node must be decreased. Note that at first transistor 110, 3x current has to be scaled to achieve 1.26 mA for this application. Therefore there is a relationship between bias current, capacitance at the charging node and the output current required for the application. As stated above, the output current is 1.26 mA. The bias current is (4x−1x)=3x (3 x 157.5 uA) and the capacitance is the sum of the gate-to-source capacitances of the first and second transistors 110 and 120 respectively. For other applications a similar relationship will exist, in each case this will depend on the output current required.

Figure 7:
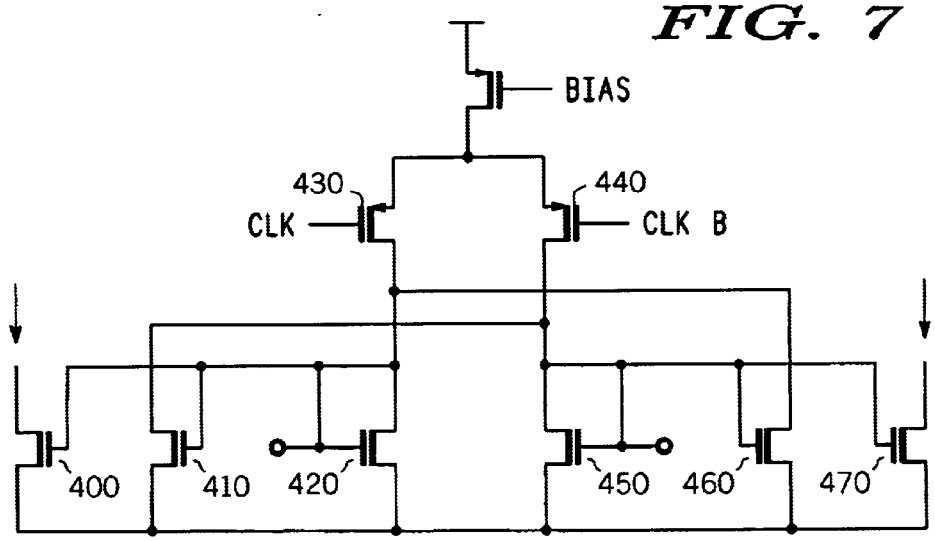
FIG. 7 shows an illustrative block diagram of an alternate embodiment of the pulse down block 90 of FIG. 2; and, FIG. 8 shows a detailed circuit implementation of the pulse up block 60 of FIG. 2.

Referring now also to FIG. 7, there is shown an alternate embodiment of the Pulse Down block 90 of FIG. 2. Devices 420 and 450 are diode connected devices similar to the second transistor 120 of FIG. 4. Devices 400 and 470 are complementary outputs (which reduce the phase noise by substantially 3 dB since the Signal-to-Noise ratio is increased by 2x). Devices 410 and 460 are used to discharge their Drain Nodes to ground when activated, and they replace the first current source 130 of FIG. 4. The cross coupling of the differential switches 430 and 440 to the devices 410 and 460 provides a positive feedback configuration.

Using this complementary action in conjunction with positive feedback further increases the switching speed (the 'sharpness' of the curve in FIG. 3b).

Figure 6:
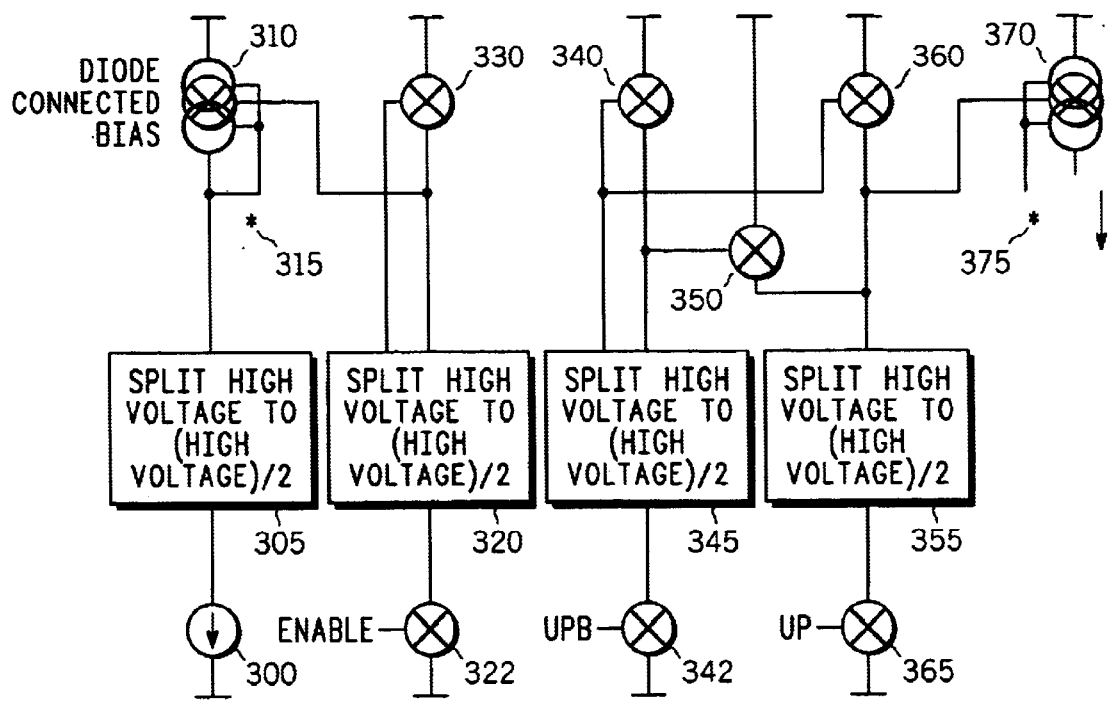
FIG. 6 shows an illustrative block diagram of the pulse up block 60 of FIG. 2.

Referring now also to FIG. 6 there is shown a detailed circuit diagram of the pulse up block 60 of FIG. 2. This comprises a reference current portion, a dc bias voltage portion and a switched current mirror output stage.

The reference current portion comprises a current source 300 coupled via a supply biased transistor stage 305 to a diode coupled cascode 310. The current source 300 provides the input bias for the cascode 310. Note that the switch is integrated into the cascode 310 in a similar manner to the first transistor 110 of the Pulse Down block of FIG. 4.

The dc bias voltage portion comprises a constant bias transistor 330 coupled via a supply biased transistor stage 320 to an 'enable' transistor 2. The dc bias portion is a bias leg which is a mirrored version of the switched current mirror output stage to be further described below. The biasing transistor 330 is used for biasing the integrated switch of the cascode 310.

The switched current mirror output stage comprises first and second switched transistors 340 and 360 respectively, and a diode coupled cascode 370 which is an output leg mirrored with the cascade 310. In this application the cascade 370 is duplicated 4 times to achieve the output current required (not shown in FIG. 6). The first switched transistor 340 is coupled via a supply biased transistor stage 345 to an 'upb' transistor 342. Similarly the second switched transistor 360 is coupled via a supply biased transistor stage 355 to an 'up' transistor 365.

A 'pull-up' transistor 350 is used to turn off the output leg. The switch is placed between the current source and the output leg for faster transients. The first and second switched transistors 340 and 360 respectively and the pull-up transistor 350 are scaled to achieve optimum slew rates for the transients. For the sake of clarity, the nodes 315 and 375 are not shown as being tied together in FIG. 6, but see FIG. 8 below.

The supply biased transistor stages 305, 320, 345 and 355 are each similar to the arrangement of the FETs 75 and 86 of FIG. 2, and are provided in order to reduce current stress across the transistors of the circuit. The current source and each of the transistors 322, 342 and 365 are NMOS devices. Each of the transistors 330, 340, 350 and 360 are PMOS devices. The cascades 310 and 370 are PMOS/NMOS devices.

Figure 8:
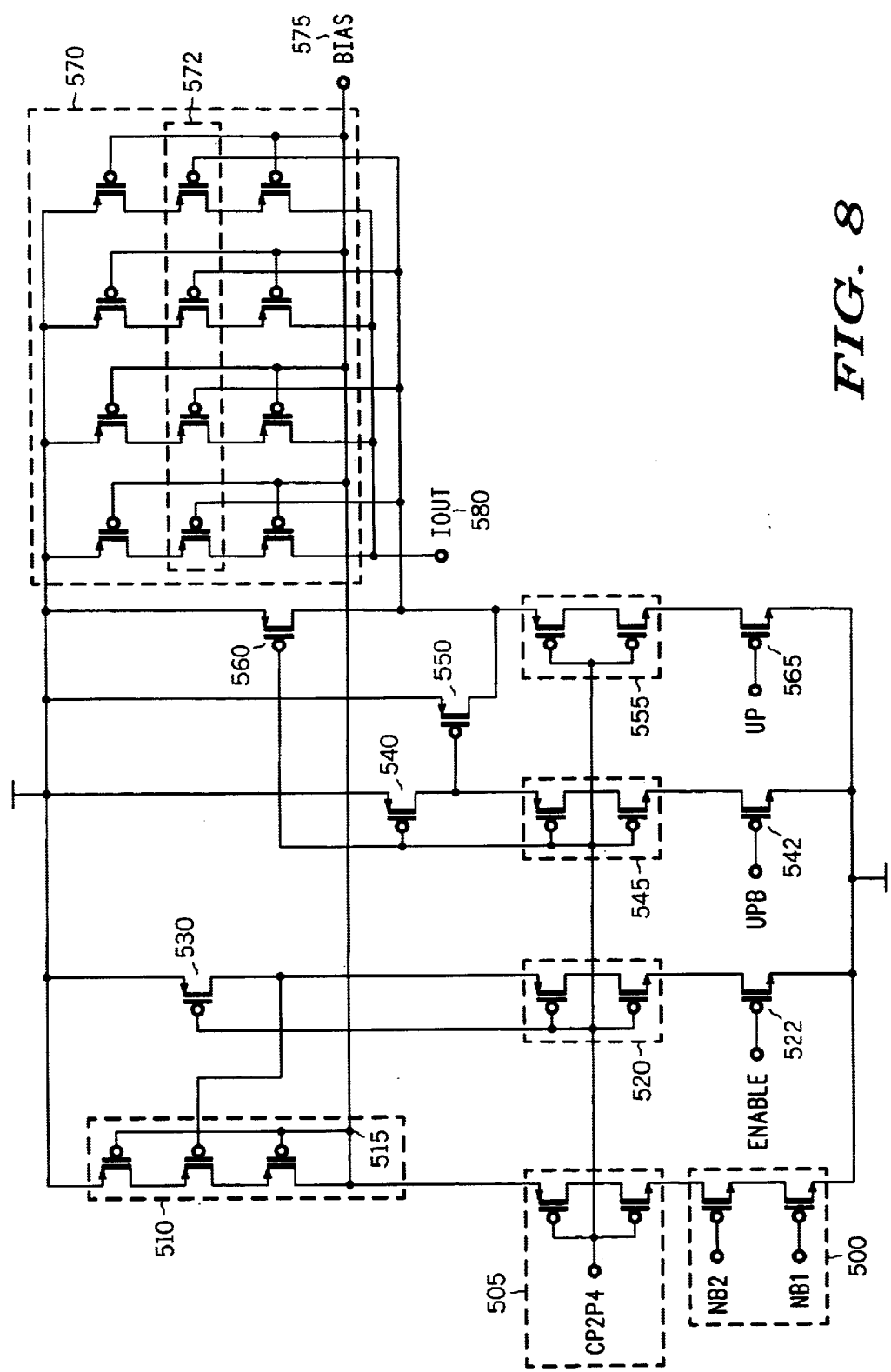

Referring now also to FIG. 8, there is shown a detailed circuit diagram of the Pulse Up block 60 of FIG. 2 (shown in less detail in FIG. 6). The following references in FIGS. 6 and 8 correspond:

| FIG. 6 | FIG. 8 |
| --- | --- |
| current source 300 | current source 500 |
| supply biased transistor stage 305 | supply biased transistor stage 505 |
| diode coupled cascode 310 | diode coupled cascode 510 |
| node 315 | node 515 |
| supply biased transistor stage 320 | supply biased transistor stage 520 |
| 'enable' transistor 322 | 'enable' transistor 522 |
| constant bias transistor 330 | constant bias transistor 530 |
| switched transistor 340 | switched transistor 540 |
| upb transistor 342 | upb transistor 542 |
| supply biased transistor stage 345 | supply biased transistor stage 545 |
| pull-up transistor 350 | pull-up transistor 550 |
| supply biased transistor stage 355 | supply biased transistor stage 555 |
| switched transistor 360 | switched transistor 560 |
| up transistor 365 | up transistor 565 |
| diode coupled cascode 370 | diode coupled cascode array 570 |
| node 375 | node 575 |

In addition, the diode coupled cascode 570 comprises a switched array of transistors 572, and an output node 580 (Iout).

In operation, a reference current is established through bias voltages nb1 and nb2 of the current source 300, with the enable transistor 522 switched 'on' via a digital enable signal (coupled to the gate of transistor 522). The up and upb transistors 522 and 542 respectively are similarly switched via phase/frequency signals up and upb, in this way switching the output current mirror. For this implementation, the output current is four times the reference current. When the digital signal up is set to logical 1, the gates of each of the switched array of transistors 572 are switched from VDD (charge pump supply voltage) down to a voltage level equal to the supply bias voltage of the stage 555 plus a PMOS threshold voltage. During this time, the multiplied reference current is sourced into the PLL filter (50 of FIG. 1). The placement of the switched array of transistors on the source side of the output current source is beneficial because in this configuration, the turn-on pulse is applied to a cascode connection avoiding any Miller multiplication and at the same time minimises clock feed-through into the output node 580.

It will be understood that the PLL arrangement, charge pump, method and mobile transceiver described above provide the following advantages:

Cascoded Current Mirrors are utilised to achieve high voltage (5V) with thin gate oxides.

Less Complexity(Reduced Die size).

Bias Currents are mirrored according to the output current required, thus giving optimal transient times and reduced phase noise.

Placing the PMOS switching transistors on the SOURCE side of the output current source is also beneficial. VCO controlled voltage can go nearer to the negative rail while maintaining the output current and high output impedance. First, it allows this charge pump circuit to present a higher output impedance to the loop filter, which improves the performance. More important is the fact that this reduces the voltage swing across the MOS devices. This allows it to work with a higher supply voltage even within a thin gate oxide process. This is key as the trend is to embed the charge pump circuits in IC's where the gate oxide thickness is small.

Typically, the present invention may be implemented in voltage ranges above 4V while the supply voltage should, on a regular basis, be in the order of 2V. This leads to reduced phase noise.

It will be appreciated that alternative embodiments to the above arrangement are possible. For example, the above charge pump arrangement can be used in conjunction with integer mode PLLs as well as FRAC-N PLLs. It can be considered that Integer Mode PLLs are a subset of FRAC-N PLLs.

Furthermore, where MOSFET devices are shown and described, these are nominally implemented in PMOS (P-type FET). However the Pulse Down circuit could alternatively be implemented using predominantly NMOS (N-type MOS) devices thus inverting the circuit design.

Also, in order to achieve even faster slew rates, instead of discharging the gate voltage of the diode connected device to ground the voltage could be discharged to just below a Vt of the NMOS device. In this way when the switch is closed the charging device need only charge to Vdsat. It is also possible to use '0 Vt' devices instead.

What is claimed is:

1. A charge pump for a phase locked loop arrangement, the charge pump comprising:
    a current source circuit having a predetermined slew rate and arranged for selectively providing charging current to the phase locked loop arrangement;
    a current sink circuit having a predetermined slew rate and arranged for selectively depleting charging current from the phase locked loop arrangement; and
    a constant current source which in locked mode is offset by current sink pulses of the current sink circuit; and wherein the current sink circuit comprises
        a current mirror comprising a first transistor and a second transistor with a gate of the first transistor coupled to a gate of the second transistor and a source of the first transistor coupled to a gate of the second transistor and the gate of the first transistor coupled to a drain of the first transistor,
        a bias current source coupled to the drain of the first transistor through a switch; and
        a leak current sink coupled to the sates of the first and second transistors; whereby when the switch is closed the current mirror is operable to mirror a differential between the bias current source and the leak current sink to the second transistor causing the current sink circuit to sink a current and the bias current source is operable to charge a parasitic capacitance of the current mirror and when the switch is open the leak current sink is operable to discharge the parasitic capacitance of the current mirror.

2. The charge pump of claim 1, further comprising a first transistor and second transistor coupled in cascode arrangement between the current source circuit and the current sink circuit.

3. The charge pump of claim 1, wherein the current source circuit and the current sink circuit each have switching transistors arranged to be switched via their source electrodes.

4. The charge pump of claim 1, wherein the current sink circuit includes a positive feedback arrangement.

5. A method of providing charge regulation for a phase locked loop arrangement, comprising the steps of:
    selectively providing charging current to the phase locked loop arrangement using a current source circuit having a predetermined slew rate; and
    selectively depleting charging current from the phase locked loop arrangement using a current sink circuit having a predetermined slew rates and comprising:
        a current mirror comprising a first transistor and a second transistor with a gate of the first transistor coupled to a gate of the second transistor and a source of the first transistor coupled to a gate of the second transistor and the gate of the first transistor coupled to a drain of the first transistor,
        a bias current source coupled to the drain of the first transistor through a switch; and
        a leak current sink coupled to the gates of the first and second transistors; and
    providing a constant current using a constant current source which in locked mode is offset by current sink pulses of the current sink circuit
        when the switch is closed using the current mirror to mirror a differential between the bias current source and the leak current sink to the second transistor causing the current sink circuit to sink a current and using the bias current source to charge a parasitic capacitance of the current mirror and
        when the switch is open using the leak current sink to discharge the parasitic capacitance of the current mirror.

6. The method of claim 5, wherein the current source circuit and the current sink circuit each have switching transistors arranged to be switched via their source electrodes.

7. The method of claim 5, wherein the current sink circuit includes a positive feedback arrangement.

8. A mobile transceiver having a phase locked loop with a charge pump, the charge pump comprising:
    a current source circuit having a predetermined slew rate and arranged for selectively providing charging current to the phase locked loop arrangement; and
    a current sink circuit having a predetermined slew rate and arranged for selectively depleting charging current from the phase locked loop arrangement; and
    a constant current source which in locked mode is offset by current sink pulses of the current sink circuit; and wherein the current sink circuit comprises
        a current mirror comprising a first transistor and a second transistor with a gate of the first transistor coupled to a gate of the second transistor and a source of the first transistor coupled to a gate of the second transistor and the late of the first transistor coupled to a drain of the first transistor, a bias current source coupled to the drain of the first transistor through a switch; and a leak current sink coupled to the gates of the first and second transistors; whereby when the switch is closed the current mirror is operable to mirror a differential between the bias current source and the leak current sink to the second transistor causing the current sink circuit to sink a current and the bias current source is operable to charge a parasitic capacitance of the current mirror and when the switch is open the leak current sink is operable to discharge the parasitic capacitance of the current mirror.

* * * * *

UNITED STATES PATENT AND TRADEMARK OFFICE
CERTIFICATE OF CORRECTION

PATENT NO. : 6,747,494 B2
DATED : June 8, 2004
INVENTOR(S) : Thomas P. Bushey et al.

It is certified that error appears in the above-identified patent and that said Letters Patent is hereby corrected as shown below:

Column 7,
Line 61, change "sates" to -- gates --.

Column 8,
Line 22, change "rates" to -- rate --.
Line 66, change "late" to -- gate --.

Signed and Sealed this

Twenty-third Day of May, 2006

JON W. DUDAS
*Director of the United States Patent and Trademark Office*